United States Patent [19]

Hallford

[11] 4,365,350
[45] Dec. 21, 1982

[54] LOW FREQUENCY CONVERTER WITH DIODE PAIR MIXER

[75] Inventor: Ben R. Hallford, Wylie, Tex.

[73] Assignee: Rockwell International Corporation, El Segundo, Calif.

[21] Appl. No.: 243,326

[22] Filed: Mar. 13, 1981

[51] Int. Cl.³ .............................................. H04B 1/26
[52] U.S. Cl. .................................... 455/330; 455/332; 332/24; 332/43 B
[58] Field of Search ......................... 455/326, 330–333; 329/163; 332/24, 43 B; 333/25; 363/159

[56] References Cited

U.S. PATENT DOCUMENTS

| | | | |
|---|---|---|---|
| 3,196,369 | 7/1965 | Darden, Jr. et al. | 332/43 B |
| 3,925,736 | 12/1975 | Lohrmann | 332/43 B |
| 3,992,674 | 11/1976 | Meyerhoff | 455/331 |
| 4,186,352 | 1/1980 | Hallford | 455/330 |

Primary Examiner—Jin F. Ng
Attorney, Agent, or Firm—Bruce C. Lutz; Howard R. Greenberg; H. Fredrick Hamann

[57] ABSTRACT

A low frequency, diode pair mixer is provided in combination with simple, compact transformer circuitry. A diode mixer bridge has a pair of diodes interconnecting secondary windings of single and dual transformers. The diodes are connected in series across the secondary winding of the single transformer. The same polarity ends of the pair of secondary windings of the dual transformer are connected in common to a point between the diodes. The other ends of the pair of secondary windings are connected to respective ends of the secondary winding of the single transformer. The combination affords isolation between the signals coupled through each of the transformers. The combination may be implemented as an up converter or a down converter.

4 Claims, 1 Drawing Figure

LOW FREQUENCY CONVERTER WITH DIODE PAIR MIXER

TECHNICAL FIELD

The invention relates to low frequency diode pair mixers and associated circuitry for up or down conversion between transformer coupled signals.

BACKGROUND AND SUMMARY

Diode pair mixers are well known in the art. The mixer performs up or down conversion between different frequency input signals. The frequencies which are output from the mixer are the modulation products which exist according to the heterodyne principle by which the mixer operates, wherein a pair of signals are applied to a nonlinear element such as a diode.

The present invention relates to low frequency diode pair mixers wherein the signal frequencies are low enough to permit coupling through transformer windings. Transformers are inherently bulky and costly to implement. The present invention evolved from efforts to provide simple, compact and low cost transformer circuitry in combination with a diode pair mixer.

DETAILED DESCRIPTION

Figure 1:
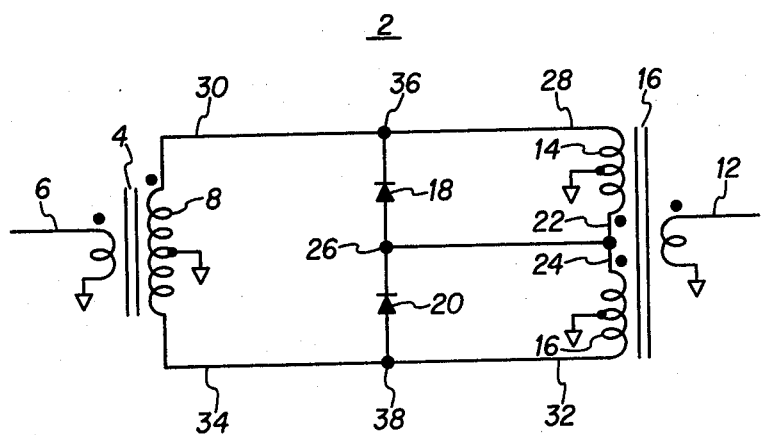
FIG. 1 is a schematic circuit diagram of a low frequency diode pair mixer frequency converter constructed in accordance with the invention.

Frequency converter 2 has a first transformer 4 with a primary winding 6 and a secondary winding 8. A dual transformer 10 has a primary winding 12 and a pair of secondary windings 14 and 16. A diode mixer bridge has a pair of diodes 18 and 20 interconnecting secondary windings 8, 14 and 16 for heterodyne modulation product signal generation.

Diodes 18 and 20 are commonly poled and connected in series across secondary winding 8 of first transformer 4. The same polarity ends 22 and 24 of secondary windings 14 and 16, respectively, are connected in common to a point 26 between the diodes. The other end 28 of secondary winding 14 is connected to the opposite polarity end 30 of a secondary winding 8. The other end 32 of secondary winding 16 is connected to the same polarity end 34 of secondary winding 8.

When converter 2 is implemented as a down converter, a signal of frequency f1 is input at 6 and a signal of lower frequency f2 is input at 12. The diode pair 18 and 20 mixes the f1 signal with the f2 signal to generate a signal having a frequency f3 which is the difference between f1 and f2. The f3 signal is coupled through transformer 10 and induced on lead 12, with windings 14 and 16 acting as primaries and winding 12 acting as a secondary for the f3 signal.

When converter 2 is implemented as an up converter, f2 and f3 signals are input at 12. The diode pair 18 and 20 mixes the signals, resulting in heterodyne modulation product signal generation by the mixer, including an f1 signal in winding 8 and hence an induced output f1 signal in winding 6.

The invention provides isolation between the f1 signal in transformer 4 and the f2 signal in transformer 10. The f2 signal coupled through transformer 10 to end leads 22 and 24 and to point 26 sees the same effective potential drop across each of diodes 18 and 20 because respective diode connection points 36 and 38 are at substantially the same potential reference level relative to f2 signals because of their connection to the other ends 28 and 32 of windings 14 and 16. Thus, no net potential is induced between leads 30 and 34 from the f2 signals on point 26, i.e., an f2 signal on point 26 sees the same potential drop to each of leads 30 and 34 and thus does not induce any new or additional net potential therebetween. The f1 signal in transformer 4 is thus isolated from the f2 signal in transformer 10.

The f2 signal in transformer 10 is likewise isolated from the f1 signal in transformer 4. The f1 signals from lead 34 and connection point 38 flow through diode 20 and then through diode 18 to connection point 36 and to lead 30. Leads 34 and 30 are each other's reference points, and hence the voltage on connection point 38 is referenced to connection point 36 and lead 30, not lead 28. The f1 signal from connection point 38 flows through diode 20 toward point 26, and then through diode 18 away from point 26, such that leads 22 and 24 and point 26 see opposite polarities (voltages which are 180° out of phase), and hence no new or additional net voltage is induced on point 26 and windings 14 and 16 by f1 signals.

It is recognized that various modifications are possible within the scope of the appended claims.

I claim:

1. A frequency converter comprising, in combination:
   a first transformer having a primary winding and a secondary winding;
   a dual transformer having a primary winding and a pair of secondary windings; and
   a diode mixer bridge having a pair of diodes interconnecting said secondary windings and connected in series across said secondary winding of said first transformer for heterodyne modulation product signal generation, wherein one end of the first secondary winding of said dual transformer and one end of the second secondary winding of said dual transformer are connected in common to a point between said diodes.

2. The invention according to claim 1 wherein:
   the other end of said first secondary winding of said dual transformer is connected to one end of said secondary winding of said first transformer; and
   the other end of said second secondary winding of said dual transformer is connected to the other end of said secondary winding of said first transformer.

3. The invention according to claim 2 wherein:
   said one ends of said first and second secondary windings of said dual transformer having the same polarity are connected to said point between said diodes;
   said other end of said first secondary winding of said dual transformer is connected to the opposite polarity end of said secondary winding of said first transformer; and
   said other end of said second secondary winding of said dual transformer is connected to the same polarity end of said secondary winding of said transformer.

4. A frequency converter comprising in combination:
   a first transformer having a primary winding and a secondary winding;
   a diode mixer bridge having a pair of diodes connected in series across said secondary winding of said first transformer;

a dual transformer having a primary winding and a pair of secondary windings, the same polarity ends of said pair of secondary windings being connected in common to a point between said diodes, the other ends of said pair of secondary windings being connected to a respective one of the ends of said secondary winding of said first transformer;

such that f1 signals coupled through said first transformer are isolated from f2 signals coupled through said dual transformer because of equal potential drops from said common point across each of said diodes relative to f2 signals, such that an f2 signal on said common point sees the same potential drop to each of said ends of said secondary winding of said first transformer and thus does not induce any new or additional net potential therebetween;

and such that f2 signals coupled through said dual transformer are isolated from f1 signals coupled through said first transformer due to opposite voltage polarity toward and away from said common point relative to f1 signals such that no new or additional net voltage is induced on said pair of secondary windings by f1 signals.

* * * * *